United States Patent

[11] 3,600,651

[72] Inventor David M. Duncan
San Francisco, Calif.
[21] Appl. No. 883,060
[22] Filed Dec. 8, 1969
[45] Patented Aug. 17, 1971
[73] Assignee Fairchild Camera and Instrument Corporation
Long Island, N.Y.

[54] BIPOLAR AND FIELD-EFFECT TRANSISTOR USING POLYCRYSTALLINE EPITAXIAL DEPOSITED SILICON

7 Claims, 8 Drawing Figs.

[52] U.S. Cl. .................................................... 317/235 R,
317/234 R, 317/235 Z, 317/235 X, 317/235 A,
317/235 B, 317/235 AN, 317/235 AT
[51] Int. Cl. .................................................... H01l 11/00
[50] Field of Search ........................................ 317/235

[56] References Cited

UNITED STATES PATENTS

| | | | |
|---|---|---|---|
| 3,189,973 | 6/1965 | Edwards et al. .............. | 29/25.3 |
| 3,514,845 | 6/1970 | Legot et al. .................... | 29/571 |
| 3,375,418 | 3/1968 | Garnache et al. ............. | 317/235 |

FOREIGN PATENTS

| | | | |
|---|---|---|---|
| 805,341 | 1/1969 | Canada ........................ | 317/235 |

*Primary Examiner*—John W. Huckert
*Assistant Examiner*—B. Estrin
*Attorneys*—Roger S. Borovoy and Alan H. MacPherson

ABSTRACT: Adjacent layers of single crystalline and polycrystalline semiconductor material are located upon a semiconductor substrate. The single crystalline layer provides for the active regions of a semiconductor device while the adjacent polycrystalline layers provide for lateral contacts to the active regions.

INVENTOR.
DAVID M. DUNCAN
BY
Alan H. MacPherson
ATTORNEY

INVENTOR.
DAVID M. DUNCAN
BY Alan H. MacPherson
ATTORNEY

BIPOLAR AND FIELD-EFFECT TRANSISTOR USING POLYCRYSTALLINE EPITAXIAL DEPOSITED SILICON

BACKGROUND OF THE INVENTION

1. Field of the Invention

This invention relates to a multilayer semiconductor structure that comprises a single crystalline silicon layer containing the active regions of a semiconductor device and adjacent polycrystalline silicon layers providing lateral contacts to the active regions.

2. Description of the Prior Art

Prior art planar semiconductor device typically are fabricated by diffusing dopant atoms of P- or N-type conductivity into a semiconductor substrate to form PN junctions, the junctions being located between the active regions. The geometry of the junction walls is usually characterized by a narrow portion near the principal substrate surface, followed by a curved portion and then a relatively wide portion in the bulk.

An insulating protective layer, such as an oxide, overlies portions of the substrate surface. Contacts to the active regions are provided by interconnection layers of conductive material located over the protective layer, the layers extending through openings in the protective layer to make contact to exposed portions of the active regions. When many semiconductor devices are fabricated into a single semiconductor wafer, isolation is often provided between devices by PN junctions that extend around each of the devices and usually from the upper to the lower surface of the substrate.

The above-described planar semiconductor device provides highly reliable operation over a wide frequency range, and is the prevalent structure in the semiconductor art. However, for some applications, the planar structure has certain disadvantages. For example, if instead of a double-diffused structure, a lateral transistor is fabricated wherein the base-emitter and base-collector junctions are located laterally adjacent one another, each extending from the substrate upper surface but spaced-apart, the fact that the base region does not have a uniform width may affect the gain and frequency of the device.

Moreover, because parasitic capacitance in a semiconductor device is a function of the area of the PN junction, for applications requiring small parasitic capacitance, it is desirable to reduce the overall junction area below that of the typical planar PN junctions.

Therefore, a different approach is desirable in order to fabricate lateral semiconductor devices so that the base thereof is relatively uniform and the overall area of the PN junctions is at a minimum.

SUMMARY OF THE INVENTION

The structure of the invention provides for vertical PN junctions having a minimum cross-sectional area in order to reduce parasitic capacitance, and for lateral transistors wherein the base is of a uniform width. Improved gain and frequency characteristics compared to prior art lateral PNP transistors, as well as better isolation, are thus available.

Briefly, the structure of the invention comprises a substrate of semiconductor material of one conductivity type having an upper surface, with a layer of insulating protective material overlying a portion of the surface while leaving a selected portion exposed. The structure is characterized in that a layer of single crystalline semiconductor material, such as silicon, overlies the exposed portion of the substrate surface and contains the active regions of a semiconductor device. Adjacent thereto and overlying portions of the protective layer are lateral layers of polycrystalline semiconductor material, such as silicon, that provide for ohmic contact to the active regions. From this basic structure, many different types of semiconductor devices can be fabricated, as are hereinafter described.

DESCRIPTION OF THE PREFERRED EMBODIMENTS

Figure 1:
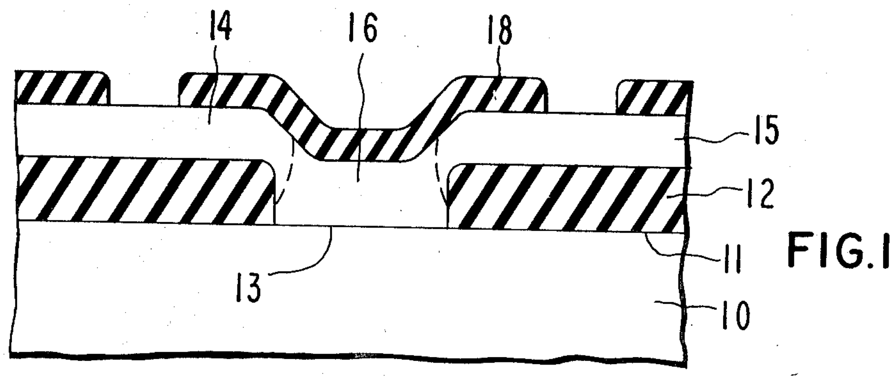
FIG. 1 is a simplified cross-sectional view of the basic structure of the invention, from which many different kinds of semiconductor devices can be fabricated.

Referring to FIG. 1, the basic structure of the invention from which many different kinds of semiconductor devices can be fabricated comprises a substrate 10 of semiconductor material, suitably of one conductivity type, such as P type, and having an upper surface 11. Throughout the following discussion, the polarities of the active regions can be reversed along with other appropriate changes without departing from the scope of the invention.

A layer of insulating protective material 12 is located over portions of the upper surface 11 of substrate 10, while leaving other portions, such as portion 13, uncovered. Protective layer 12 preferably comprises an oxide, either thermal or vapor deposited, and approximately 3,000 angstroms to 1 micron thick.

A layer 16 of single crystalline semiconductor material, such as epitaxial silicon, is located upon the exposed surface 13, while layers 14 and 15 of polycrystalline semiconductor material, such as silicon, are located over the protective layer 12. Preferably, layers 14, 15, and 16 are formed using a silane decomposition process. The substrate 10 is placed in a reactor and a vapor of silane ($SiH_4$) at approximately 1,020° C. is passed over the surface, resulting in the deposition of polycrystalline layers 14 and 15 over the oxide 12, and the epitaxial growth of single crystalline layer 16 over the exposed semiconductor material 13. Typically, layers 14, 15, and 16, may vary in thickness from one-half to 5 microns. During this step, dopant atoms of a desired conductivity type may be deposited within the single crystalline layer 16, or even within the polycrystalline layers 14 and 15.

The epitaxial single crystalline layer 16 is particularly suitable for the active regions of a semiconductor device whereas polycrystalline layers 14 and 15 provide for electrical contact to the active regions. Polycrystalline silicon has a relatively high diffusion rate for dopants compared to that of single crystalline silicon; the diffusion coefficient in the former is approximately five times greater than that in the latter, particularly when the dopant atoms are boron.

Another insulating layer 18, preferably an oxide approximately 3,000 angstroms to 1 micron thick, is located atop portions of the semiconductor layers 15 and 16, while leaving other portions exposed.

Figure 2:
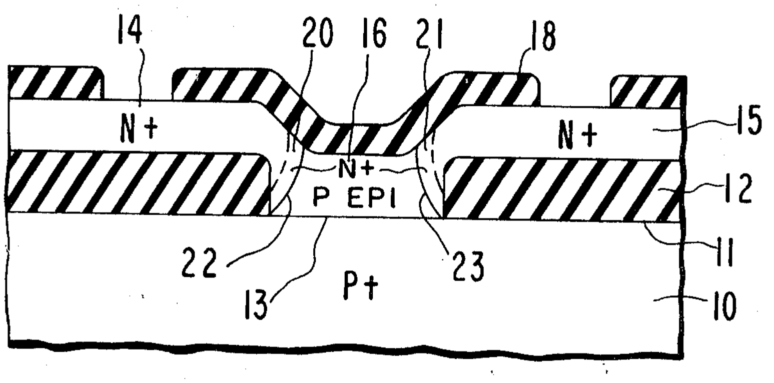
FIG. 2 is a simplified cross-sectional view of a lateral bipolar transistor with an epitaxial base.

Referring to FIG. 2, a lateral bipolar transistor with an epitaxial base comprises the substrate 10 having dopant atoms of one conductivity type, such a P type therein. Suitably, P-type dopant atoms are also formed in layer 16 during the epitaxial growth of the latter. Portions of the second oxide layer 18 are removed to expose portions of polycrystalline layers 14 and 15. Predeposition and diffusion steps are performed to deposit dopant atoms of N-type conductivity throughout layers 14 and 15. Deposition of the dopant atoms may be via a gaseous predeposition process, or by placing dopant atoms along the upper portion of the first oxide layer 12, after which the diffusion step is performed. Because of the high diffusion rate of the dopant atoms in polycrystalline silicon, the atoms quickly travel through layers 14 and 15 until the atoms reach single crystalline layer 16. Here, because the diffusion rate is much slower, relatively narrower regions 20 and 21 of N-type conductivity are created in layer 16.

Narrow region 20 forms a first PN junction 22 with a central portion of layer 16, whereas narrow region 21 forms a second PN junction 23 with the central portion of layer 16. The lateral distance between the two junctions 22 and 23 along the upper surface 13 of substrate 10 typically is approximately 2½ to 5 microns. The width of narrow regions 20 and 21 is approximately one-half micron each. Narrow region 20 is the emitter, the central portion of layer 16 is the base, and narrow region 21 is the collector of a lateral NPN transistor.

Figure 3:
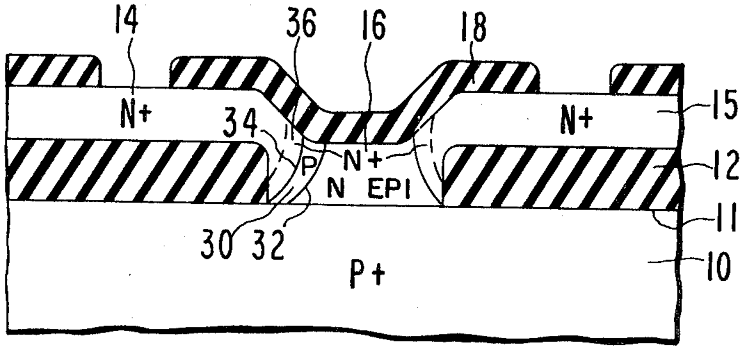
FIG. 3 is a simplified cross-sectional view of a lateral bipolar transistor with a graded base.

Referring to FIG. 3, a lateral bipolar transistor with a graded base comprises the semiconductor substrate 10 having dopant atoms of one conductivity type, such as P type, therein. Suitably, during the step of forming layers 14, 15, and 16, dopant atoms of N-type conductivity are deposited therein. Next, dopant atoms of P-type conductivity are predeposited onto and exposed portion of layer 14 and then diffused therein. The atoms rapidly fill the polycrystalline layer 14 until they reach layer 16, where the diffusion rate is much lower. A narrow region 30 of P-type conductivity is formed in a portion of layer 16, creating a PN junction 32 with the remainder of layer 16, the junction extending vertically from the lower to the upper surface of layer 16. Next, dopant atoms of N-type conductivity are diffused into polycrystalline layers 14 and 15, and into portions of layers 16 adjacent layers 14 and 15. A second PN junction 34 is formed between narrow region 30 and narrow region 36. Typically, narrow regions 30 and 36 are approximately 1 micron wide. The structure of FIG. 3 is that of a lateral bipolar NPN transistor, wherein narrow region 36 is the emitter, narrow region 30 is the base, and the remainder of layer 16 is the collector. The impurity concentration of base region 30 is graded, but has a uniform width throughout, as it is formed by a double-diffusion process wherein first P-type and then N-type dopant atoms are deposited via polycrystalline layer 14.

Figure 4:
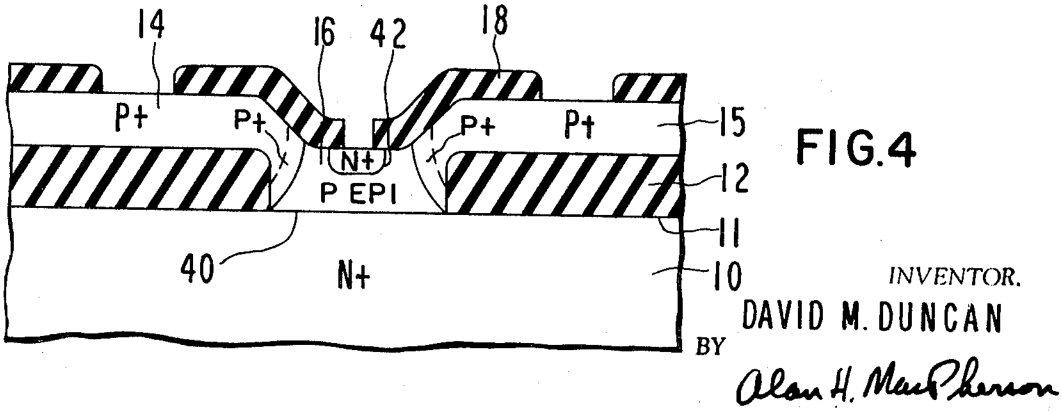
FIG. 4 is a simplified cross-sectional view of a vertical bipolar transistor with an epitaxial base.

Referring to FIG. 4, a vertical bipolar transistor with an epitaxial base comprises the substrate 10 having dopant atoms of N-type conductivity therein. During the step of epitaxially growing layer 16, dopant atoms of P-type conductivity are formed therein, so that a PN junction 40 is created between substrate 10 and layer 16. Next, dopant atoms of P-type conductivity are diffused rapidly into polycrystalline layers 14 and 15. A portion of insulating layer 18 is then removed to expose a portion of single crystalline layer 16. Dopant atoms of N-type conductivity are diffused into the exposed portion of layer 16 to form a PN junction 42 therein, the junction having an edge at the upper surface of layer 16. The structure of FIG. 4 comprises a vertical bipolar transistor, wherein substrate 10 is the collector, layer 16 is the base, and the region enclosed by junction 42 is the emitter.

Figure 5:
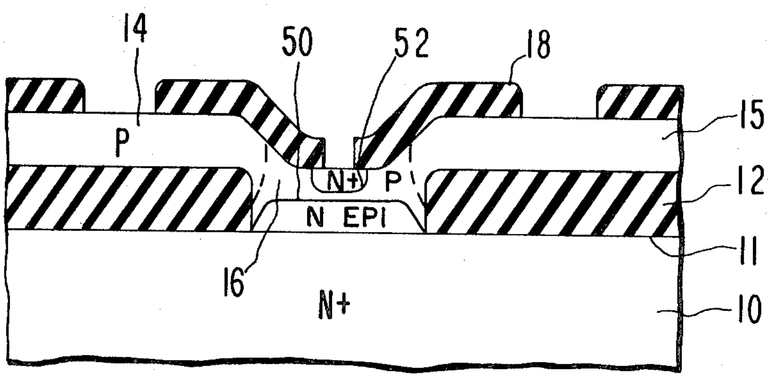
FIG. 5 is a simplified cross-sectional view of a vertical bipolar transistor with a graded base.

Referring to FIG. 5, a vertical bipolar transistor with a graded base comprises substrate 10 of N-type conductivity. The single crystalline layer 16 is epitaxially grown so that dopant atoms of N-type conductivity are located therein. Prior to forming the second insulating layer 18, dopant atoms of P-type conductivity are next diffused into the polycrystalline layers 14 and 15, and into the single crystalline layer 16. The latter diffusion step forms PN junction 50, which extends laterally across layer 16. Insulating layer 18 is then deposited, or grown, over the exposed surface of layers 14, 15, and 16. A portion of layer 18 is subsequently removed to expose a portion of single crystalline layer 16. Into this exposed portion are deposited dopant atoms of N-type conductivity, which form PN junction 52. Junction 52 has an edge at the upper surface of layer 16 and is spaced apart from PN junction 50. The structure of FIG. 5 comprises a vertical bipolar NPN transistor wherein the portion of layer 16 enclosed by junction 50 is the collector, the P-type portion of layer 16 is the base, and the region enclosed by junction 52 is the emitter.

Figure 6:
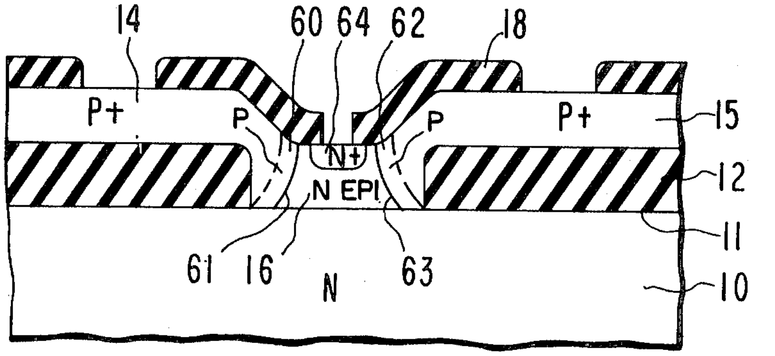
FIG. 6 is a simplified cross-sectional view of a vertical field-effect transistor.

Referring to FIG. 6, the vertical junction field-effect transistor comprises the substrate 10 of N-type conductivity. During the epitaxial growth of single crystalline layer 16, dopant atoms of N-type conductivity are formed therein. Next, dopant atoms of P-type conductivity are diffused into polycrystalline layers 14 and 15. The latter diffusion step continues in order to form narrow regions 60 and 62 in the single crystalline layer 16. First and second PN junctions 61 and 63 are created between respective narrow regions 60 and 62 and the remaining central portion of layer 16. A portion of oxide layer 18 is then removed to expose a portion of the single crystalline layer 16. Dopant atoms of N-type conductivity are diffused into a portion of single crystalline layer 16 to form a contact region 64 therein. Substrate 10 and contact region 64 comprise the source and drain regions of a field-effect transistor, with the central portion of layer 16 comprising the channel region therebetween. Control of the conductivity of channel region 16 is provided by narrow regions 60 and 62, which surround the channel. If desired, regions 60 and 62 can be connected together as one control region. Upon application of voltage signals of suitable polarity to polycrystalline layers 14 and 15, the conductivity of channel region 16 can be increased or decreased.

Figure 7:
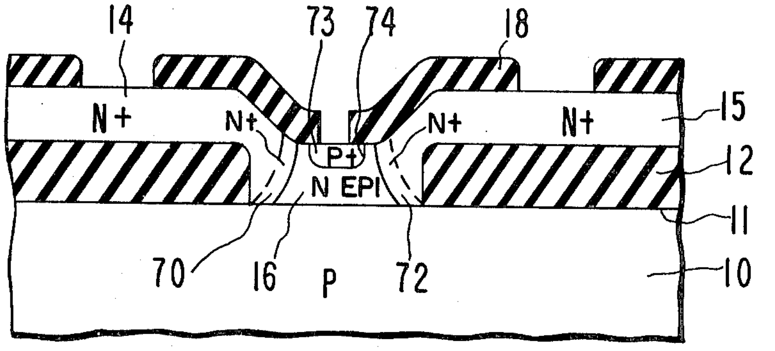
FIG. 7 is a simplified cross-sectional view of a lateral junction field-effect transistor.

Referring to FIG. 7, the lateral junction field-effect transistor comprises the substrate 10 of P-type conductivity. Epitaxial layer 16 is grown with dopant atoms of N-type conductivity located therein. Next, dopant atoms of N-type conductivity are diffused into polycrystalline layers 14 and 15. The latter diffusion step continues in order to form narrow regions 70 and 72 of higher impurity concentration that that of the remainder of layer 16. A portion of oxide layer 18 is then removed to expose a portion of layer 16. Dopant atoms of P-type conductivity are diffused into layer 16 to form PN junction 74, the junction having an edge at the upper surface of layer 16. Narrow regions 70 and 72 are the source of drain of a field-effect transistor, with the remainder of layer 16 the channel region. Conductivity of channel region 16 is controlled by the application of voltage signals of appropriate polarity to the region enclosed by PN junction 74, which functions as the gate.

Figure 8:
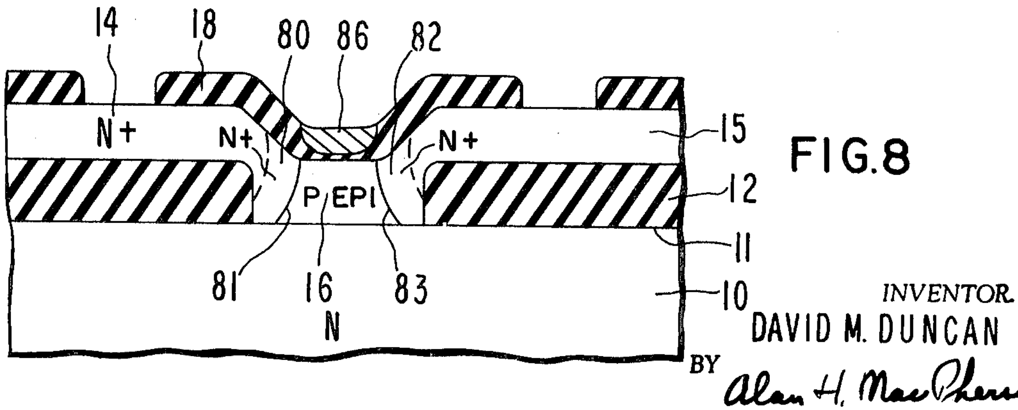
FIG. 8 is a simplified cross-sectional view of a lateral conductor-insulator-semiconductor field-effect transistor.

Referring to FIG. 8, the lateral conductor-insulator-semiconductor field-effect transistor comprises the semiconductor substrate 10. Suitably, epitaxial layer 16 is grown with dopant atoms of P-type conductivity located therein. Dopant atoms of N-type conductivity are then diffused into polycrystalline layers 14 and 15. The latter diffusion step continues until the atoms form narrow regions 80 and 82 in layer 16. First and second PN junctions 81 and 83 are created between respective narrow regions 80 and 82 and the remaining central portion of layer 16. A conductive material 86 is embedded into a portion of oxide layer 18 overlying layer 16. Narrow regions 80 and 82 are the source and drain, and the remainder of layer 16 is the channel of a field-effect transistor. Control of the conductivity of channel 16 is provided by the embedded conductor 86, which is the gate.

While the invention has been described with reference to particular embodiments, the scope of the invention includes other embodiments incorporating the principles of the invention which will be obvious to one skilled in the art.

I claim:

1. A structure comprising a substrate of semiconductor material of one conductivity type having an upper surface, and a layer of insulating protective material overlying a portion of the upper surface while leaving a selected portion exposed, the structure characterized in that:

a layer of single crystalline semiconductor material overlies the exposed portion of the substrate surface, said layer being divided into at least three active regions, an intermediate one of which is sandwiched between the other two, said intermediate region being of one conductivity type, each of the other two regions thereby forming a PN junction with said intermediate region, said PN junctions extending from the upper to the lower surface of said single crystalline layer, forming a lateral bipolar transistor with said intermediate region comprising the base region, said other two regions comprising the emitter and the collector regions, and a layer of polycrystalline semiconductor material overlies a portion of the protective layer, said polycrystalline semiconductor layer being of the same conductivity type as and contiguous with said other two regions of said single crystalline layer, portions of said polycrystalline layer providing means for making separate electrical contact to said emitter and collector regions.

2. The structure as recited in claim 1 further defined by a layer of insulating protective material overlying portions of the polycrystalline and single crystalline layers including the upper surface edge of PN junctions.

3. A structure comprising a substrate of semiconductor material of one conductivity type having an upper surface, and a layer of insulating protective material overlying a portion of the upper surface while leaving a selected portion exposed, the structure characterized in that:

a layer of single crystalline semiconductor material overlies the exposed portion of the substrate surface and contains active regions; and a layer of polycrystalline semiconductor material overlies a portion of the protective layer and provides contacts to the active regions within the single crystalline layer, the polycrystalline layer and a first portion of the single crystalline layer are of opposite conductivity type, a second portion of the single crystalline layer is of one conductivity type forming a first PN junction with the first portion, the first junction having an edge at the layer lower surface, the structure further defined by a region of one conductivity type located within the first portion forming a second PN junction therewith, the second junction having an edge at the layer upper surface, the region and second portion being separated from each other, so that a vertical bipolar transistor is provided wherein the first portion comprises a graded base, the second portion comprises the collector, and the region comprises the emitter.

4. The structure as recited in claim 3, further defined by an insulating protective layer overlying portions of the polycrystalline and single crystalline layers including a surface edge of the second PN junction.

5. A structure comprising a substrate of semiconductor material of one conductivity type having a upper surface, and a layer of insulating protective material overlying a portion of the upper surface while leaving a selected portion exposed, the structure characterized in that:

a layer of single crystalline semiconductor material overlies the exposed portion of the substrate surface and contains active regions; and a layer of polycrystalline semiconductor materials overlies a portion of the protective layer and provides contacts to the active regions within the single crystalline layer, the polycrystalline layer and adjacent portions of the single crystalline layer are of opposite conductivity type, and the remaining portion of the single crystalline layer is of one conductivity type to form at least one PN junction between the first and second portions, the junction extending from the lower to the upper surface of the layer, the structure further defined by a region of high impurity concentration of one conductivity type located within the second portion and extending from the layer upper surface, so that a vertical junction field-effect transistor is provided, wherein the second portion comprises the channel region, the substrate and region comprise the source and drain regions, and the polycrystalline layer comprises the gate contact that controls the conductivity of the channel region.

6. The structure as recited in claim 5 further defined by an insulating protective layer overlying portions of the polycrystalline and single crystalline layers, including an edge of the PN junction.

7. A structure comprising a substrate of semiconductor material of one conductivity type having an upper surface, and a layer of insulating protective material overlying a portion of the upper surface while leaving a selected portion exposed, the structure characterized in that:

a layer of single crystalline semiconductor material overlies the exposed portion of the substrate surface and contains active regions; and a layer of polycrystalline semiconductor material overlies a portion of the protective layer and provides contacts to the active regions within the single crystalline layer, the polycrystalline layer and adjacent portions of the single crystalline layer are of one conductivity type, and the remaining portion of the single crystalline layer is of opposite conductivity type forming first and second PN junctions, the junctions extending from the lower to the upper surface of the singly crystalline layer, the structure further defined by:

an insulating protective layer overlying portions of the polycrystalline and single crystalline layers, including an edge of the first and second PN junctions;

an area of conductive material seated in the insulating layer above the single crystalline region to control the conductivity thereof, so that a lateral conductor-insulator-semiconductor field-effect transistor is provided wherein the adjacent portions are the source and drain, the remaining portion is the channel, and the conductive area is the gate.